US 6,549,406 B1

(12) United States Patent
Olesiewicz et al.

(10) Patent No.: US 6,549,406 B1
(45) Date of Patent: Apr. 15, 2003

(54) FAN TRAY ASSEMBLY FOR AN ELECTRONICS ENCLOSURE

(75) Inventors: Timothy W. Olesiewicz, Cupertino, CA (US); Robert J. Lajara, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/142,100

(22) Filed: May 9, 2002

(51) Int. Cl.[7] ................................................. H05K 7/20
(52) U.S. Cl. .................. 361/695; 417/423.14; 454/184; 165/80.3; 361/726
(58) Field of Search ................................ 165/80.3, 122; 62/259.2; 361/687, 694–697, 724–727; 417/53, 423.14, 423.5, 423.15; 415/176–178; 454/184

(56) References Cited

U.S. PATENT DOCUMENTS

| | | | | |
|---|---|---|---|---|
| 4,926,291 A | * | 5/1990 | Sarraf | 361/695 |
| 5,955,955 A | * | 9/1999 | Corcoran, Jr. et al. | 361/695 |
| 6,071,082 A | * | 6/2000 | Lecinski et al. | 361/695 |
| 6,186,889 B1 | * | 2/2001 | Byrne | 454/184 |
| 6,252,770 B1 | * | 6/2001 | Yu et al. | 361/695 |
| 6,285,548 B1 | * | 9/2001 | Hamlet et al. | 361/695 |
| 6,388,880 B1 | * | 5/2002 | El-Ghobashy et al. | 361/695 |

* cited by examiner

Primary Examiner—Gregory Thompson
(74) Attorney, Agent, or Firm—O'Melveny & Myers LLP

(57) ABSTRACT

A fan tray assembly for an electronics enclosure includes two opposing, spaced apart shells made of a sheet material. The opposing shells are attached to each other by attachment features formed in the sheet material of each shell. Advantageously, the attachment features reduce or eliminate the need for separate fasteners or adhesive to attach the shells. Each shell has openings forming a grill. The grill is aligned with a similarly formed grill of an opposing shell. Each shell also has retention features formed in the sheet material around a periphery of their respective grills. A ventilation fan is retained between the two shells by the retention features, in alignment with the grill of each shell. An electrical connector is connected to the ventilation fan and retained by at least one of the shells. The electrical connector is exposed by an opening of the fan tray assembly and oriented towards an exterior thereof. The shells may also include features for retaining the electrical connector without using fasteners or adhesive. Such features may allow the connector to float in a plane perpendicular to its principle axis of alignment. The assembly may additionally include a latch for latching the assembly to the electronic enclosure.

39 Claims, 5 Drawing Sheets

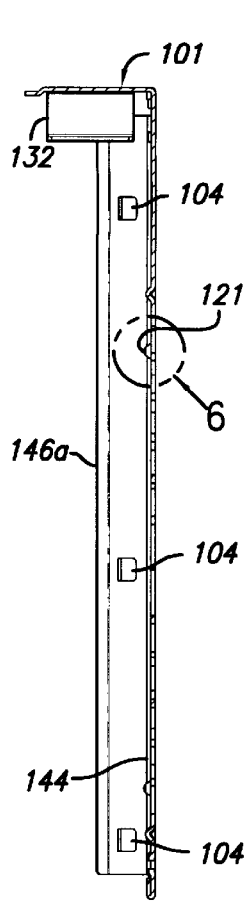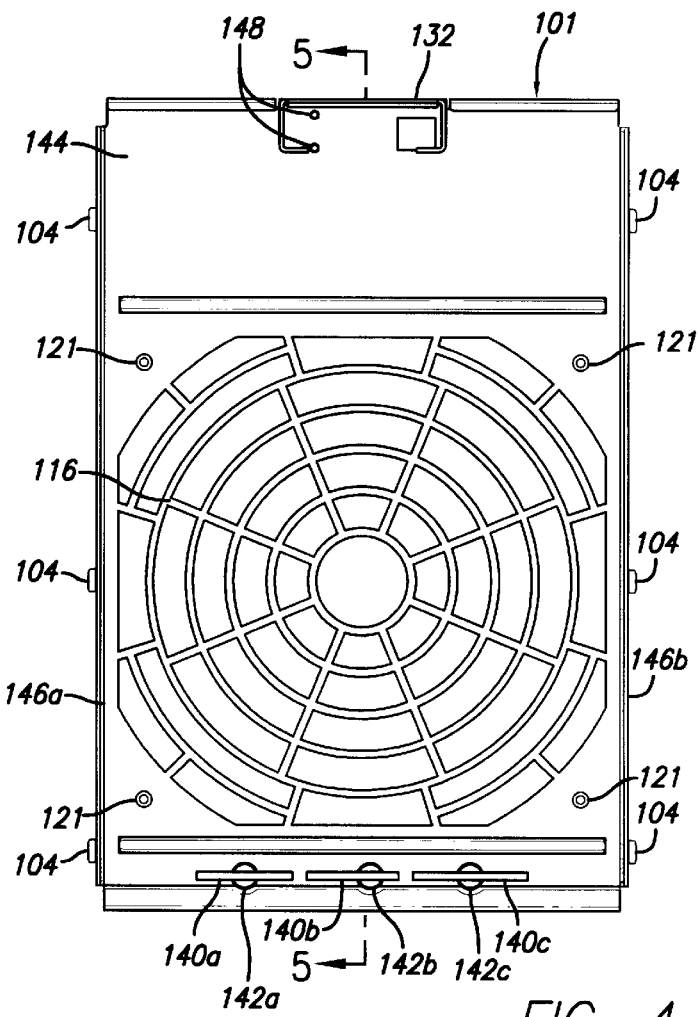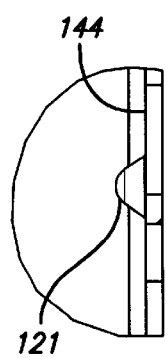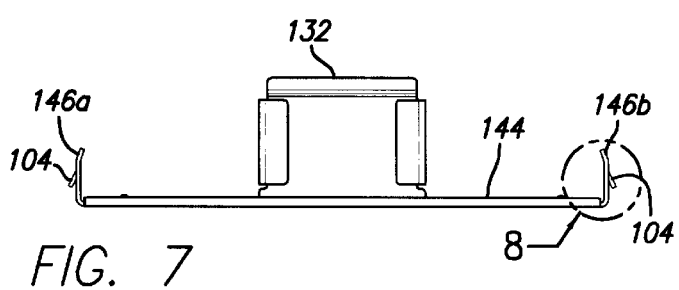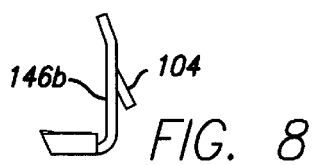
FIG. 5
FIG. 4
FIG. 6
FIG. 7
FIG. 8

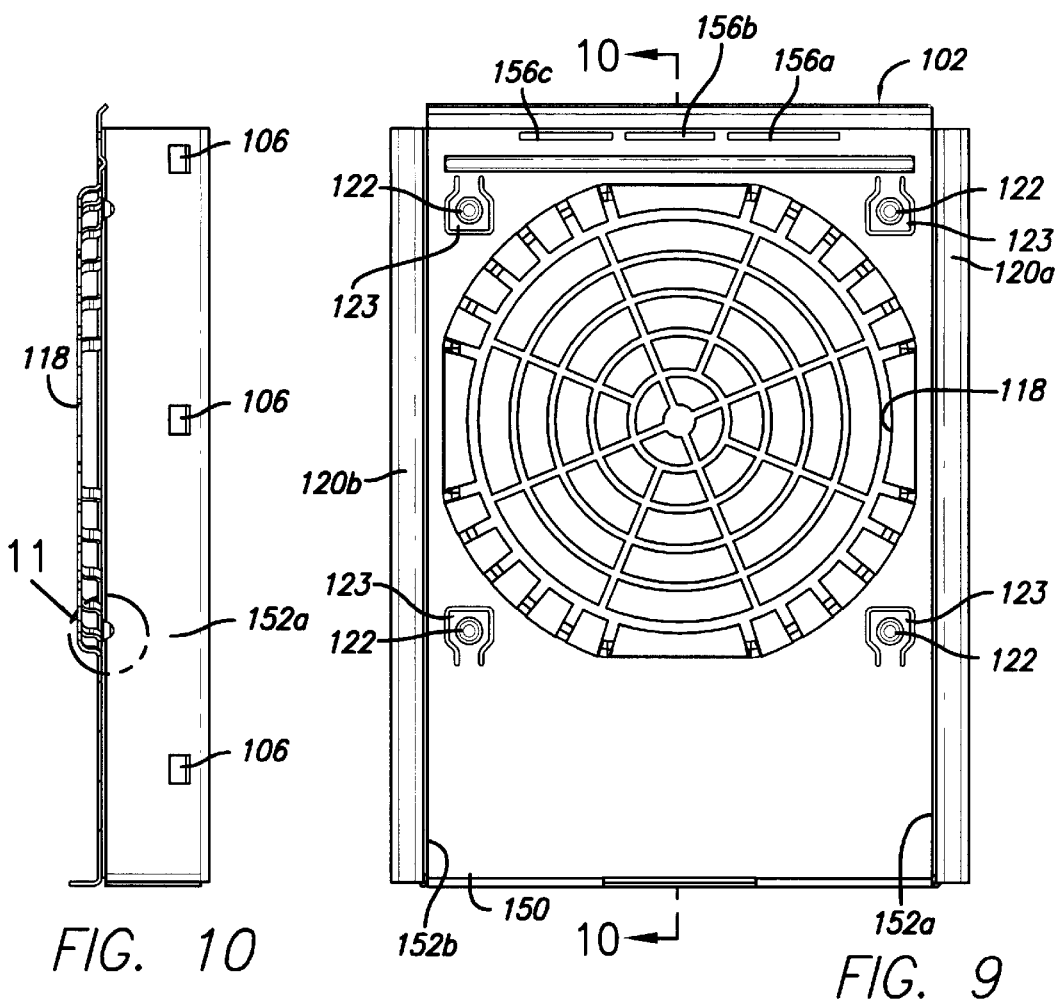
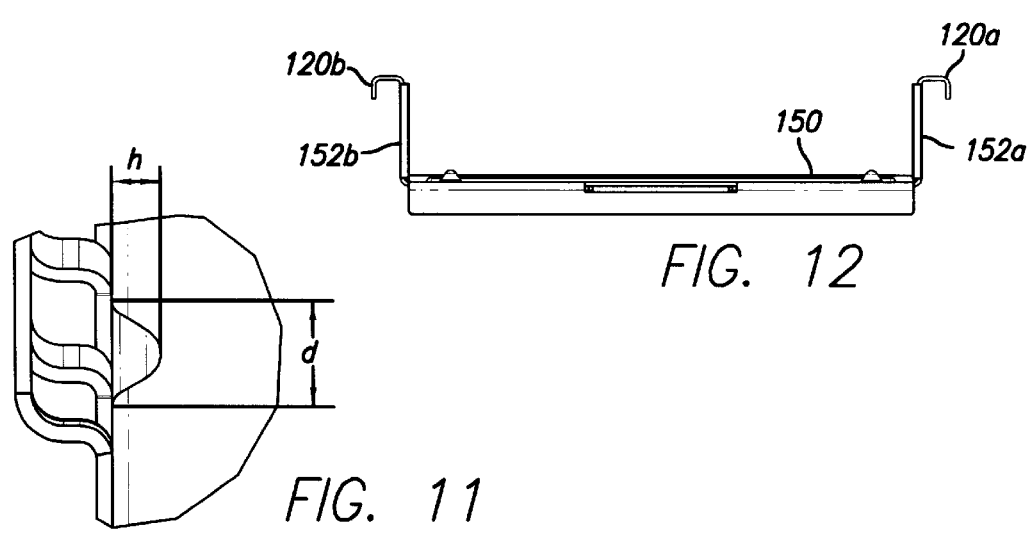
FIG. 10
FIG. 9
FIG. 11
FIG. 12

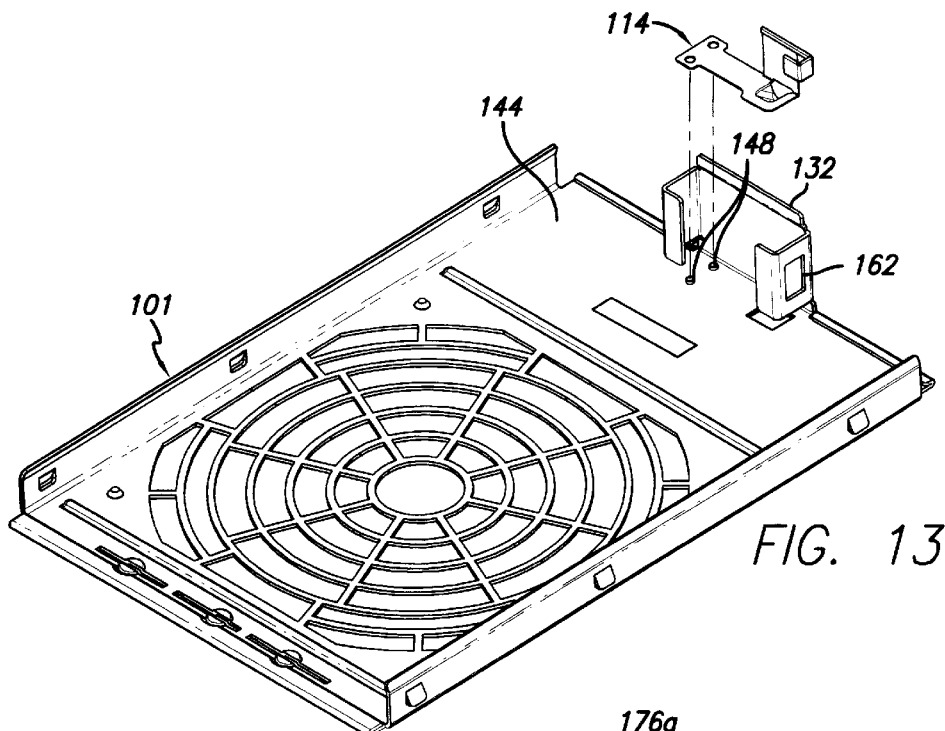
FIG. 13
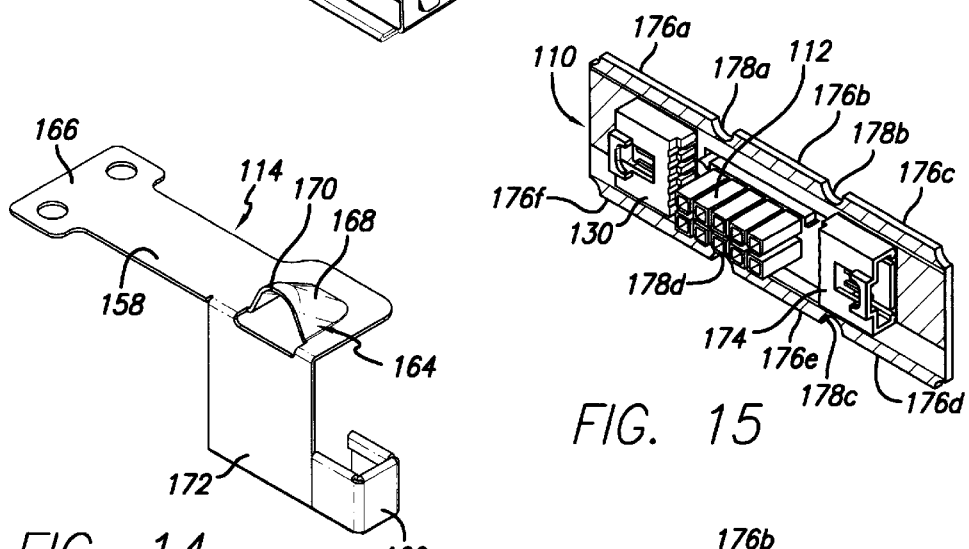
FIG. 14
FIG. 15
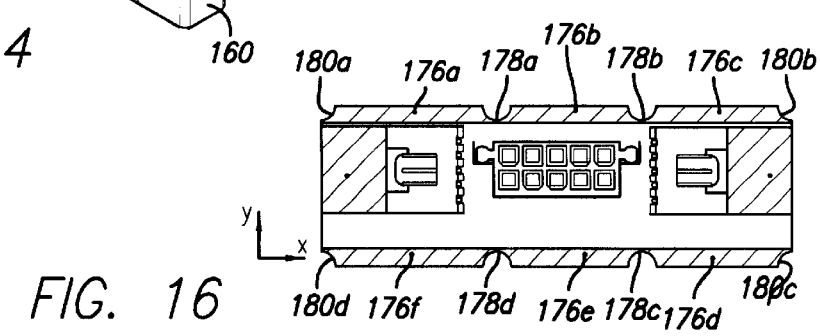
FIG. 16

FAN TRAY ASSEMBLY FOR AN ELECTRONICS ENCLOSURE

BACKGROUND OF THE INVENTION

1. Field of the Invention

The present invention relates to modular ventilation fan assemblies for electronics enclosures.

2. Description of Related Art

Modular ventilation fan assemblies, sometimes called fan tray assemblies (or more briefly, "fan trays") are used for mounting ventilation fans to electronics enclosures, such as computer enclosures. Conductive enclosures are used to contain electromagnetic interference (EMI) generated by electronic equipment, and ventilation fans are often used for thermal control of their enclosed interior spaces. The fan tray provides for convenient mounting of one or more ventilation fans to the electronics enclosure while maintaining the EMI-shielding integrity of the enclosure. The fan tray may also provide a convenient location for mounting a control circuit for the ventilation fan or fans in the fan tray.

The ventilation fan itself is usually a modular unit that includes a rotor and a motor encased in a plastic housing. As such, it does not provide EMI shielding and may itself be a source of EMI. Fan trays therefore typically provide metal grills on opposite sides of the fan to electromagnetically isolate the ventilation fan from the environment outside of the fan tray, while allowing for the passage of air through the fan tray. At the same time, the metal grills and sheet metal walls of the fan tray maintain electromagnetic isolation for the interior of the electronics enclosure and serve as part of the wall thereof.

Fan trays are often mounted to the electronics enclosures using a pair of opposing side rails that engage corresponding rails in the electronics enclosure. The fan tray may be mounted to, and removed from, the enclosure by sliding the tray along these rails. The fan tray may be secured to the enclosure using a screw or like fastener after being slid into place along the rails. As modular assemblies, prior art fan trays facilitate assembly and repair of electronics enclosures, particularly when a fan control circuit is included in the fan tray.

However, prior art fan trays are subject to various shortcomings. They are typically assembled from sheet metal components and fastened together using screws or like fasteners. Screws are also used to fasten assembled fan trays to electronics enclosures. The use of screws or like fasteners increases assembly and removal time, and increases the number of tray components. Both of these factors can add substantially to the cost of fan trays, as well as create inconveniences for users.

A further disadvantage of prior art fan trays is that the fan control circuit on a printed circuit board (PCB) is fixed to the sheet metal components of the tray. Attachment of the PCB to the tray may require the use of separate fasteners, which are undesirable for reasons noted above. In addition, in whatever manner the PCB is attached, fixing the controller PCB to the fan tray housing may limit the ease with which it may be electrically connected to the electronics in the enclosure. The controller PCB has an outwardly-facing electrical connector socket for mating with a matching plug connected to wiring in the electronics enclosure. Fixing the PCB (and hence, the connector socket) to the fan tray may encumber engagement of the connector plug, necessitating additional manipulation during assembly. Other shortcomings of prior art fan trays include air grills that are too restrictive of air flow.

It is therefore desirable to provide a fan tray that overcomes these and other shortcomings of prior art fan trays, while retaining their advantages.

SUMMARY OF THE INVENTION

The present invention provides a fan tray assembly that requires no removable fasteners or other loose hardware in its assembly. The fan tray may be used with prior art electronics enclosures while requiring minimal or no modifications to the enclosure. Like prior art trays, it may be installed and removed from an enclosure by sliding along an engaging pair of rails. It may be assembled from inexpensive sheet metal pieces (shells) that are self-aligning and self-fastening, for decreased assembly cost. For this purpose, the shells may include attachment features for attaching the shells to one another, and retention features for retaining a ventilation fan between the shells. the attachment and retention features may be formed integrally with the shells from the same sheet of material. Taken together, the attachment and retention features may reduce or eliminate the need to use loose hardware or adhesive for fastening during assembly.

Advantageously, the fan tray also does not require use of a separate fastener to secure it to an enclosure. Instead, it may be secured to an enclosure using a spring loaded latch that is integrated into the fan tray. The latch automatically engages when the fan tray is fully inserted into the engaging rails of an enclosure. It may be configured to be disengaged for removal of the fan tray by a one-handed, squeeze and pull operation, greatly increasing the convenience of assembly and repair.

The fan tray also provides for attachment of a controller PCB without the use of any fasteners. The PCB, defining an x-y plane, is oriented with an electrical connector extending from the fan tray along a z-axis perpendicular to the x-y plane of the PCB. The PCB is substantially fixed with respect to its z-axis but is permitted to float with respect to the x-y plane. Misalignment between the connector and a mating connector fixed to the electronics enclosure may readily be corrected for within the limits of the float. Accordingly, the connector may be readily engaged by merely applying pressure along the z-axis, which is parallel to the side rails. An electrical connection to the fan tray assembly may thus be established by inserting the fan tray into the enclosure, without any need for a separate operation to mate the electrical connectors. Likewise, the electrical connectors preferably can be disengaged merely by withdrawing the fan tray. In addition, the fan tray is preferably configured so that proper orientation of the PCB is ensured during assembly.

Other beneficial features of the fan tray assembly include improved air grills that substantially improve air flow through the fan tray. A more complete understanding of the fan tray assembly will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 4 is a plan view of an exemplary top shell of the fan tray.

FIG. 5 is a side view of the top shell shown in FIG. 4.

FIG. 6 is a detail view of a retention dimple on the top shell shown in FIGS. 4–5.

FIG. 7 is an end view of the top shell shown in FIGS. 4–5, showing a handling tab for mounting a latch mechanism.

FIG. 8 is a detail edge view of an integral assembly clip on an engaging surface of the top shell.

FIG. 9 is a plan view of an exemplary bottom shell of the fan tray for use with the top shell shown in FIGS. 4–8.

FIG. 10 is a side view of the bottom shell shown in FIG. 9.

FIG. 11 is a detail view of a retention dimple on the bottom shell shown in FIGS. 9–10.

FIG. 12 is an end view of the bottom shell shown in FIGS. 9–10, showing an edge view of the fan tray mounting rails.

FIG. 13 is a perspective, interior exploded assembly view of the top shell and an exemplary latch.

FIG. 14 is a detail perspective view of the latch.

FIG. 15 is a perspective view of an exemplary controller PCB suitable for use as a connector shell.

FIG. 16 is a plan view of the controller PCB shown in FIG. 15, showing an exemplary mounting tab arrangement.

DETAILED DESCRIPTION OF THE PREFERRED EMBODIMENT

The present invention provides a fan tray assembly that overcomes the limitations of prior art fan trays. In the detailed description that follows, like element numerals are used to indicate like elements that appear in one or more of the drawings.

Figure 1:
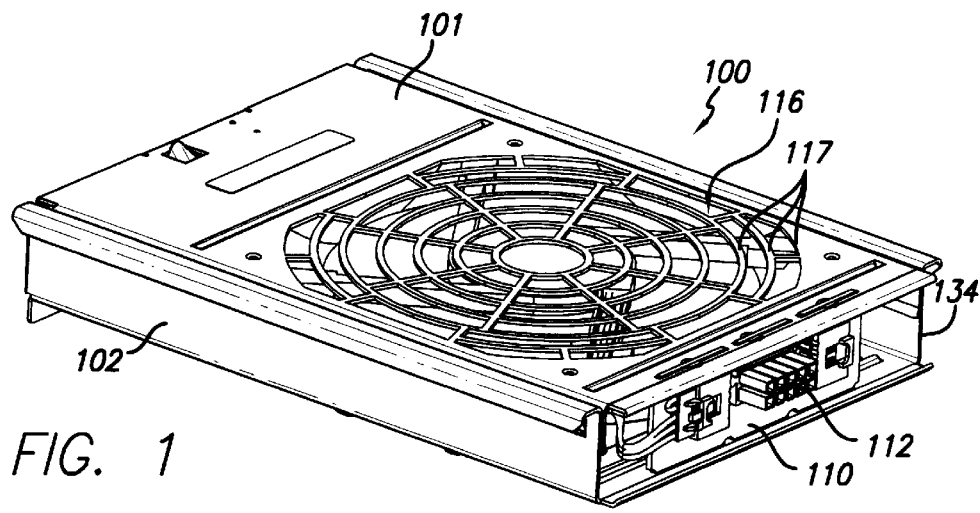
FIG. 1 is a perspective view of an exemplary fan tray assembly, as viewed from the controller PCB side.
Figure 2:
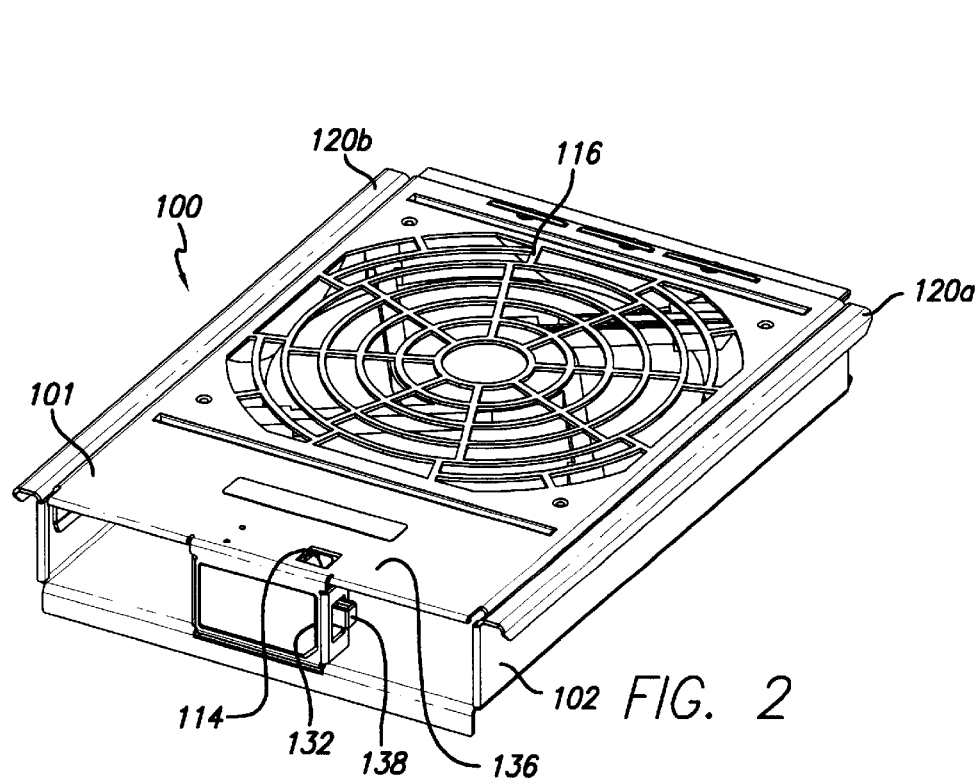
FIG. 2 is a perspective view of an exemplary fan tray assembly, as viewed from the latch side.
Figure 3:
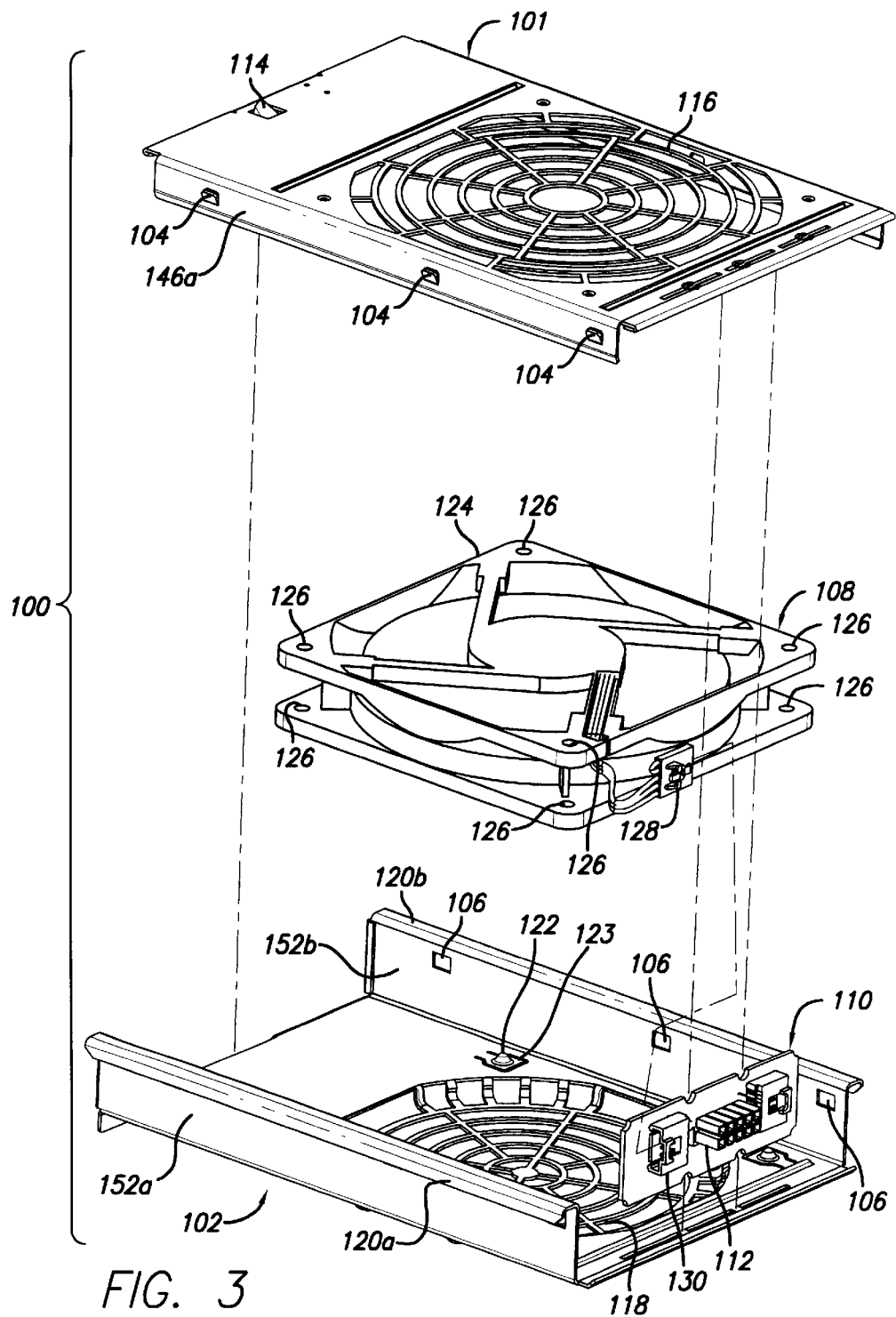
FIG. 3 is an exploded assembly view of an exemplary fan tray assembly.

Referring to FIGS. 1–3, exemplary fan tray 100 comprises two opposing shells 101, 102, sometimes called brackets. The shells 101, 102 are attached to one another using a plurality of interlocking attachment features, such as spring tabs 104 and corresponding slots 106, shown in FIG. 3. Each shell is made of a suitable sheet material, such as sheet steel or other conductive and structural material, which may be suitably surface treated or coated as known in the art. All of the features of the shells may be formed in the same sheet of material, such as by a suitable stamping and bending operation, thereby eliminating unnecessary assembly operations.

Each of shells 101, 102 has a plurality of openings 117 forming a grill for passage of air through the shell, of which a grill 116 in the top shell is shown in FIGS. 1–2. A grill 118 in the bottom shell is shown in FIG. 3. Grill 116 is substantially aligned with grill 118 in the opposing shell, for efficient air flow through the fan tray.

A ventilation fan 108 is retained between the two shells by retention features, such as dimple 122 shown in FIG. 3. The retention features are described in more detail below. The ventilation fan, as known in the art, comprises a rotor (not shown) encased in a frame 124. Frame 124 may include one or more features for engagement with retention features (such as dimple 122) of the shells. For example, the fan frame 124 may include a plurality of through holes 124. Such holes are commonly used in prior art assemblies for holding threaded fasteners used for attaching the fan to an assembly. Utilization of these holes in a new and different way in the present assembly advantageously allows the fan tray assembly to make use of commonly available prior art ventilation fans. Ventilation fan 108 additionally includes a cable connector 128 for connecting the fan to a power source.

Assembly 100 additionally includes an electrical connector 112 for transmitting power to the ventilation fan. Connector 112 may also be used to transmit signals and power to a control circuit in the fan tray. It may be connected to the ventilation fan using cable connector 128, mating connector 130, and circuits in PCB 110, or in some other fashion. Connector 112 is retained by the shells 101, 102 such that it is exposed by an opening 134 of the fan tray 100, and oriented towards an exterior of the fan tray, as shown in FIG. 1. Connector 112 may be retained by mounting to a PCB that is, in turn, retained by the shells 101, 102, as shown. In the alternative, PCB 110 may be replaced by a passive structural plate (for example, if no control circuit is needed in the fan tray), or mounted to the fan tray separate from a PCB or plate. The embodiment shown in FIGS. 1–3 has the advantage of retaining the connector and a control circuit using the same mounting system, which is described in more detail below.

Parallel rails 120a, 120b are preferably provided on opposing sides of the fan tray 100, as shown in FIGS. 1 and 2. Rails 120a, b are configured to engage complementary rails in a parent electronics enclosure assembly. Using the rails, the fan tray may be slid into position for assembly, and removed from the assembly, with a single motion. Rails 120a, b define a longitudinal axis that is parallel to an axis of engagement of connector 112, herein called a "z-axis." Therefore, the connector may be engaged/disengaged as a consequence of the insertion/removal of the fan tray from a parent assembly.

The fan tray assembly may further include a latch 114 extending from a surface 136 of one of the shells, such as shell 101, for latching the fan tray to a parent electronics enclosure assembly. Latch 114 may reduce or eliminate the need for a separate fastener to secure the fan tray 100 to a parent assembly. The latch may be configured to operate by deflection of an elastic member, and to automatically latch when the fan tray is fully inserted into the parent assembly. It may include a depressible button 138 for actuating flexure of the latch to unlatch it from the parent assembly. Latch 114 may be enclosed in a handle 132 for pulling the fan tray from a parent assembly. The handle may be positioned at an end of the fan tray opposite to the opening 134 in which connector 112 is located. The embodiment as shown may be unlatched and removed from a parent assembly by depressing button 138 while pulling on the handle 132 in a one-handed "squeeze and pull" operation. Further details of latch 114 are provided below.

It should be apparent that fan tray assembly 100 reduces or eliminates any need to use separate fasteners or adhesives in its assembly. As used herein, a "separate fastener" is any piece of loose fastening hardware, such as a screw, bolt, rivet, clip, tie, and so forth. "Adhesive" is used broadly to include solder, braze, and welded material, as well as resin-based adhesive material. Shells 101, 102 may be attached by the attachment features 104, 106 without the use of separate fasteners or adhesives. Likewise, the ventilation fan 108 may be retained between the shells without the use of separate fasteners or adhesives.

As used herein, the terms "top" and "bottom" when applied to the shells is used merely for convenience to indicate the relative positions of the shells as shown in FIGS. 1–3. It should be apparent that these terms do not in any way limit the orientation of the fan tray; for example, the fan tray may be oriented so that the "top" shell is underneath the "bottom" shell, and vice-versa. It should further be apparent that the features described herein as being on one of the shells may instead be provided on the other shell, so long as the complementary nature of the shells is preserved. For example, the spring tabs 104 on the top shell 101 may be provided on the bottom shell 102, so long as complementary slots 106 are provided for them on the top shell. Many such variations are possible within the general parameters of complementary interlocking shells in a fan tray assembly according to the invention.

FIGS. 4–8 show an exemplary top shell 101 made from sheet material. A suitable shape for grill 116 is shown in plan view in FIG. 4. Retention features (dimples) 121 are shown arranged around a periphery of grill 116. The dimples 121 protrude towards the interior side 144 of shell 101, and are positioned to correspond with mounting holes in a ventilation fan frame. A detail side view of a dimple 121 is shown in FIG. 6. In an embodiment of the invention, dimple 121 is a substantially hemispherical protrusion having a radius sufficiently small to engage the holes of the fan frame. A hemispherical shape has the advantage of being readily formed without overstressing the sheet material.

Other shapes may be used for the fan retention features. For example, a pyramidal protrusion may be pressed into the sheet material for engaging a round or square hole in a fan frame. Or, the sheet material may be cut and shaped to provide a tab configured to fit in a hole or slot in a fan frame, or around exterior parts of a fan frame. In the alternative, a hole or recess could be formed in surface 144 for receiving a protruding feature of a fan frame. Whatever the configuration of the fan retention features, shells 101, 102 should be configured to compress the ventilation fan between their interior surfaces to prevent shifting or rattling of the fan during handling or operation. In an embodiment of the invention, this compression may be supplied mainly by retention dimples 122 on spring tabs 123, as shown in FIGS. 3 and 9.

Shells 101, 102 are attached to one another with the help of spring tabs 104. The spring tabs are formed in the sheet material of the shell and extend from side walls 146a, 146b away from shell 101 for engaging corresponding slots in sidewalls of shell 102. A detail side view of a spring clip is shown in FIG. 8. Spring tabs 104 spring through corresponding slots 106 in shell 102 when shell 101 is fully inserted therein, locking the shells together. Side walls 152a,b of shell 102 are biased towards walls 146a, b, respectively, of shell 101, providing a clamping force to ensure that tabs 104 remain seated in slots 106.

When attached by the attachment features (e.g., spring tabs 104 and slots 106) the interior distance between the opposing shells should be such that the retention features 121 (and corresponding features 122 on shell 102) cause the spring tabs 123 and/or shells to flex outward and compress the ventilation fan enough to hold it firmly in position. At the same time, the outward pressure exerted by the ventilation fan on the interlocked shells via spring tabs 123 may help keep the shells locked firmly in position.

This balancing of inward compression on the fan and outward pressure on the shells stabilizes the assembly. Too much compression will impede assembly of the fan tray and may damage components. Too little compression will result in an unstable, rattling fan tray. One of skill in the art may select a suitable sheet material and geometry to achieve a proper amount of compression for a given application.

Spring tabs 123 advantageously provide additional resiliency to the assembled shells with respect to the fan, thereby easing the degree of precision to which the shells need be made.

Handle 132 may be formed in the sheet material of shell 101 at one end. Holes 148 may be provided in the sheet material for attaching a latch. The position of the handle, at one end of the shell 101 and centrally located between side walls 146a, 146b, conveniently permits use as a handle and helps assure that the forces associated with insertion and withdrawal of the fan tray are symmetrical with respect to rails 120a, 120b and along the z-axis of connector 112 of the PCB assembly. The handle 132 interlocks with the opposing shell 102 to distribute insertion and extraction forces to both halves of assembly 100.

Near another end of shell 101 opposite to the handle 132, a series of mounting slots 140a, 140b, 140c may be provided for a controller PCB 110. The slots should be just wide enough to provide a clearance fit for the edges of the PCB. At the same time, the slots should be long enough to permit some motion (i.e., "float") of the PCB in a direction parallel to the long edges of the slot. Preferably, the slots are asymmetrical with respect to a central axis (which axis would appear vertical in FIG. 4), so that the PCB can be inserted into the slot only when it is properly oriented with respect to shell 101. Dimples 142a–c spanning respective slots 140a–c and protruding towards the interior surface 144 may be formed in the sheet material of shell 101. Dimples 142a–c help ensure that the PCB remains retained by slots 140a–c during flexure of shell 101.

Various other features may be used to retain the PCB 110 or other mounting plate for connector 112, without departing from the scope of the invention. For example, circular holes in surface 144 could be formed to accommodate pins or narrow tabs protruding from a PCD or other plate. For further example, the connecter 112 could be retained by a bracket comparable to handle 132. In the alternative, a separate clip, fastener or mounting bracket could be used.

FIGS. 9–12 show an exemplary bottom shell 102 for use with shell 101, and features thereof. Grill 118 is formed in the sheet material of the shell so as to be substantially aligned with grill 116 of shell 101. As shown in FIG. 10, grill 118 need not be coplanar with the shell wall. It may be positioned towards the exterior of the shell to improve air flow through the grill and reduce the acoustic noise of the assembly.

As in shell 101, retention features 122 may be formed in the sheet material of shell 102 around the periphery of grill 118 for retaining the ventilation fan 108. Again, dimple shapes may be selected to match available features on the fan frame. A detail view of dimple 122 is shown in FIG. 11. It may be desirable to make the dimensions "h" and "d" of dimples 122 somewhat larger than the corresponding dimples 121 in shell 101. The larger size may help ensure that sufficient compression of the fan frame is achieved after assembly. At the same time, smaller dimples 121, which are primarily for locating the fan frame with respect to the shells, may better engage the holes of the fan frame. One set of larger dimples 121 and one set of smaller dimples 121 may be advantageous for retaining a fan having mounting holes of equal size. To reduce the probability of overcompression from the larger dimples 122, they may be positioned on spring tabs 123 cut in the sheet material. The spring tabs 123 increase the range of acceptable flexure of the assembly, thereby reducing sensitivity to tolerance build-up.

Side walls 152a, 152b extend from the interior surface 150 of shell 102 for a distance sufficient to enclose the sides of the fan tray assembly. Attachment features 106 (three of six shown) are slots configured to engage with the spring tabs 104 of shell 101. Rails 120a, 120b may be provided along the free edges of walls 152a, 152b, respectively. Slots 156a–c are for retaining the controller PCB 110, similarly to slots 140a–c in shell 101.

FIG. 13 shows the assembly of latch 114 to the top shell 101. FIG. 14 shows an enlarged view of the exemplary latch. Latch 114 may be formed from a sheet of elastic material, such as a steel sheet. In the alternative, it may be formed from a wire or bar of elastic material, or by casting, molding, or other forming process; or may be formed integrally in the same sheet of material as shell 101. In an embodiment of the invention, latch 114 comprises an elastic member 158 extending between a base 166 and a latch tooth 164. A tab (button) 160 for actuating flexure of elastic member 162 is connected to the elastic member by a lever 172. The latch tooth 164 comprises a ramp 168 and an engagement edge 170.

The base 166 of the latch may be attached to surface 144 of shell 101 by any suitable method, such as staking or spot welding. When the fan tray 100 is assembled, the button 160 extends through the button hole 162, and the latch tooth 164 extends through surface 144 and above surface 136 (shown in FIG. 2). Preferably, when the fan tray 100 is inserted into a parent assembly, interaction between the latch tooth and the parent assembly causes the latch to be engaged when the fan tray is fully inserted. The latch may then be disengaged by squeezing the sides of handle 132, thereby depressing button 160. By the action of lever 172, the elastic member 158 is flexed away from surface 144, disengaging the latch. The fan tray may then be removed from the parent assembly by pulling on the handle 132.

Various other latch configurations may be used to achieve the same or a similar latching and unlatching action. Nor is it necessary that the latch be enclosed by a handle. Also, latch 114 may be omitted entirely, if desired.

FIGS. 15 and 16 show an exemplary controller PCB 110 for use with fan tray 100. PCB 110 defines an x-y plane on which connectors 112, 130, and 174 are located. The x-y plane is shown in plan view in FIG. 16. Connector 112 is for connecting the PCB to a parent assembly, and extends perpendicularly from the board 110 along a z-axis. Connectors 130, 174 are for connecting to a fan (or fans) in the fan tray. Board 110 may be of a uniform thickness that is sufficiently less than the width of the mounting slots 140a–b and 156a–b to permit sliding of the board relative to the slots.

PCB 110 may contain a control circuit and/or electrical traces connecting connectors 112, 130, and 174. In an alternative embodiment, PCB 110 may be replaced by a purely mechanical board or plate, for example, for connecting a ventilation fan directly to an external control circuit. It should be apparent that, in either case, a connector mounted on the board or plate may be retained in the fan tray by the shells 101, 102 without using a separate fastener or adhesive.

It is desirable that the connector be free to move ("float") in the x-y plane within a defined range, to compensate for tolerance build-up and facilitate making a connection to a fixed connector in a parent assembly. A suitable amount of float may be provided by the configuration of tabs 176a–f. Specifically, notches 178a–d and 180a–d may be configured so that each tab 176a–f is shorter in the "x" direction than its corresponding slot in one of shells 101, 102. Thus, the PCB 110 is provided a desired amount of play in the "x" direction. Also, the notches may be deeper than is needed to fit between the shells 101, 102, thereby providing the PCB with a desired amount of play in the "y" direction. Notches 178a–d and 180a–d may conveniently be formed in a PCB material by drilling or punching holes along the score line for adjacent boards, thereby notching two boards with a single operation. Semi-circular notches as shown can be configured to provide a substantially equal amount of float in the "x" and "y" directions.

To ensure that the controller PCB 110 is assembled in the correct orientation with respect to the fan tray, the configuration of the tabs may be asymmetrical with respect to a central vertical ("y") axis of the PCB. For example, notches 178a and 178d are positioned closer to the central axis than notches 178b, 178c.

Having thus described a preferred embodiment of a fan tray for an electronic enclosure, it should be apparent to those skilled in the art that certain advantages of the within system have been achieved. It should also be appreciated that various modifications, adaptations, and alternative embodiments thereof may be made within the scope and spirit of the present invention. For example, a fan tray for a single ventilation fan has been illustrated, but it should be apparent that the inventive concepts described above would be equally applicable to fan trays for multiple ventilation fans. For further example, particular shapes of shells, tabs, dimples, slots, latches, grills, and so forth, have been illustrated, but one of ordinary skill may devise other suitable shapes for such elements in conformance with the inventive concepts herein. The invention is further defined by the following claims.

What is claimed is:

1. A fan tray assembly for an electronics enclosure, comprising:
   two opposing, spaced apart shells made of a sheet material and attached to each other by a plurality of attachment features formed in the sheet material of each shell, each shell having a plurality of openings forming a grill substantially aligned with a grill of an opposing shell, and a plurality of retention features formed in the sheet material around a periphery of the grill;
   a ventilation fan retained between the two shells by the retention features and substantially aligned with the grill of each shell; and
   an electrical connector connected to the ventilation fan and retained by at least one of the shells, the electrical connector exposed by an opening of the fan tray assembly and oriented towards an exterior thereof.

2. The fan tray assembly of claim 1, further comprising two parallel rails each disposed on an opposing side of the fan tray assembly and configured to engage complementary rails in the electronics enclosure.

3. The fan tray assembly of claim 1, wherein each of the retention features further comprises a dimple in the sheet metal configured to fit at least partially inside of a corresponding hole in a frame of the ventilation fan.

4. The fan tray assembly of claim 1, wherein at least selected ones of the retention features are located on spring tabs cut from the sheet material.

5. The fan tray assembly of claim 1, wherein the fan tray assembly includes no separate fastener and no adhesive for attaching the two shells together.

6. The fan tray assembly of claim 1, wherein the fan tray assembly includes no separate fastener and no adhesive for attaching the ventilation fan to the fan tray assembly.

7. The fan tray assembly of claim 1, wherein the fan tray assembly includes no separate fastener and no adhesive for retaining the electrical connector.

8. The fan tray assembly of claim 1, wherein the fan tray assembly includes no threaded fastener.

9. The fan tray assembly of claim 1, wherein the fan tray assembly includes no adhesive.

10. The fan tray assembly of claim 1, wherein the plurality of attachment features are located on side walls of the shells.

11. The fan tray assembly of claim 1, wherein selected ones of the attachment features comprise spring tabs extending from at least one of the shells.

12. The fan tray assembly of claim 11, wherein selected other ones of the attachment features comprise slots in at least one of the shells configured to fit the spring tabs.

13. The fan tray assembly of claim 1, further comprising means for retaining the electrical connector.

14. The fan tray assembly of claim 1, wherein the electrical connector is mounted to a plate defining an x-y plane with the electrical connector extending along a z-axis perpendicular to the x-y plane.

15. The fan tray assembly of claim 14, wherein the plate further comprises a printed circuit board containing a control circuit.

16. The fan tray assembly of claim 14, wherein the plate is without folds.

17. The fan tray assembly of claim 14, wherein the plate is disposed between and retained by the two shells.

18. The fan tray assembly of claim 14, wherein the plate is substantially fixed with respect to the z-axis and is free to move within defined limits in the x-y plane.

19. The fan tray assembly of claim 14, wherein the plate comprises a plurality of tabs arranged along a peripheral edge of the plate.

20. The fan tray assembly of claim 19, wherein the plurality of tabs are inserted into corresponding slots in the shells.

21. The fan tray assembly of claim 20, wherein the plurality of tabs and the corresponding slots are configured so that the plate is substantially fixed with respect to the z-axis and is free to move within defined limits in the x-y plane.

22. The fan tray assembly of claim 1, further comprising means for latching the fan tray assembly to the electronics enclosure.

23. The fan tray assembly of claim 1, further comprising a latch extending from a surface of at least one shell for latching the fan tray assembly to the electronics enclosure.

24. The fan tray assembly of claim 1, wherein the latch is configured to operate by deflection of an elastic member.

25. The fan tray assembly of claim 24, wherein the latch is enclosed in a handle.

26. The fan tray assembly of claim 24, wherein the latch comprises an elastic member extending between a base and a tooth.

27. The fan tray assembly of claim 25, wherein the tooth comprises a ramp and an engagement edge.

28. The fan tray assembly of claim 24, wherein the elastic member is connected to a tab configured for actuating flexure of the elastic member to unlatch the latch.

29. The fan tray assembly of claim 28, wherein the tab is configured as a depressible button and protrudes from the handle, whereby the latch is unlatched by squeezing the handle.

30. The fan tray assembly of claim 1, further comprising a handle connected to the shells at an end of the fan tray assembly opposite to the electrical connector.

31. The fan tray assembly of claim 30, wherein the handle is configured as a tab extending into a space between the shells.

32. The fan tray assembly of claim 30, wherein the handle does not extend from the fan tray assembly.

33. The fan tray assembly of claim 1, wherein the grill of at least one of the shells protrudes from a surface of the at least one shell towards an exterior of the fan tray assembly.

34. A fan tray assembly for an electronics enclosure, comprising:
   two opposing, spaced apart shells attached to one another, each shell having a plurality of openings forming a grill, with each grill substantially aligned with a grill of an opposing shell;
   means for attaching the shells to one another without using a separate fastener and without using an adhesive; and
   a ventilation fan retained between the two shells and substantially aligned with a grill of each shell.

35. The fan tray assembly of claim 34, further comprising means for retaining the ventilation fan between the two shells without using a separate fastener and without using an adhesive.

36. The fan tray assembly of claim 34, further comprising an electrical connector connected to the ventilation fan and retained by at least one of the shells, the electrical connector exposed by an opening of the fan tray assembly and oriented towards an exterior thereof.

37. The fan tray assembly of claim 36, further comprising means for retaining the electrical connector without using a separate fastener and without using an adhesive.

38. The fan tray assembly of claim 36, further comprising means for retaining the electrical connector so that it is substantially fixed with respect to a first axis and free to move within defined limits in a plane perpendicular to the first axis.

39. The fan tray assembly of claim 34, further comprising means for latching the fan tray assembly to the electronics enclosure.

* * * * *